United States Patent

Morman et al.

Patent Number: 5,940,788
Date of Patent: Aug. 17, 1999

[54] METHOD AND SYSTEM FOR DESIGNING VEHICLE DOOR SEALS BASED ON PREDICTED SOUND TRANSMISSION CHARACTERISTICS

[75] Inventors: Kenneth Nero Morman, West Bloomfield; Yuksel Gur, Ann Arbor, both of Mich.

[73] Assignee: Ford Global Technologies, Inc., Dearborn, Mich.

[21] Appl. No.: 08/850,308

[22] Filed: May 2, 1997

[51] Int. Cl.$^6$ ............................. H04R 29/00; G06T 17/00
[52] U.S. Cl. ............................. 702/138; 702/39; 181/210
[58] Field of Search ................................... 364/558, 578, 364/550, 551.01, 580, 552; 73/37, 587, 645; 181/210, 284, 211; 296/39.3, 211; 361/56; 702/138, 140, 182, 39

[56] References Cited

U.S. PATENT DOCUMENTS 5,568,404 10/1996 Strumolo .................................. 364/558

OTHER PUBLICATIONS

Kempfer, "A Sealing for Prototypes", Computer–Aided Engineering, pp. 10–11, Jan. 1996.

author unknown, "Taking the Stress Out of Seal Design: Computers Simplify Selection Process", Design Engineering, pp. 10–13, Sep. 1994.

Fireman, "Using PC–Based Seal Analysis Reduces Prototypes", Rubber World, p. 18, Mar. 1996.

Internet Web Page of EASi Software Products—Vista Architecture, pp. 1–3, Feb. 13, 1998.

author unknown, "Software Supplies Solutions in Seal Design", Design Engineering, p. 12, May 1993.

George, A.R. (1990) "Automobile Aerodynamic Noise", SAE International Congress and Exposition, Michigan, SAE Paper No. 900315.

George, A.R. and J. R. Callister(1991) "Aerodynamic Noise of Ground Vehicles", SAE Paper No. 911027.

Van den Brulle, P.J. and A. Ulrich (1981) "Determination of the Sound Pressure Distribution Along the Door Slits of a Passenger Car", Proceedings of 1981 Inter–Noise Conference.

Abaqus Theory Manual, Version 5.5, "Frequency Domain Viscoelastiity", pp. 4.7.3–1, 7.I.1–5.

Morman, Jr., K.N. and J. C. Nagtegaal (1983) "Finite Element Analysis of Sinusoidal Small–Amplitude Vibrations in Deformed Viscoelastic Solids, Part 1: Theoretical Development", International Journal for Numerical Methods in Engineering, 19, pp. 1079–1103.

*Primary Examiner*—Patrick Assouad
*Attorney, Agent, or Firm*—David B. Kelley

[57] ABSTRACT

A method and system for designing a door seal system is based upon a predicted contribution of the door seal system to sound pressure levels (SPLs) within a vehicle due to wind noise. A door seal system design is selected and a door seal system deformed geometry is determined. The deformed door seal system and acoustic media are combined to produce a fully coupled acoustic/structure model of the door seal system. A sound transmission loss is predicted for the door seal system design under predetermined conditions using acoustics, finite deformation rubber elasticity, and steady state harmonic viscoelasticity. The sound transmission loss and interior SPLs are then displayed, and the door seal design changed according to predefined rules to produce a seal design which provides a desired SPL in the vehicle.

9 Claims, 14 Drawing Sheets

* FINITE ELEMENT ANALYSIS

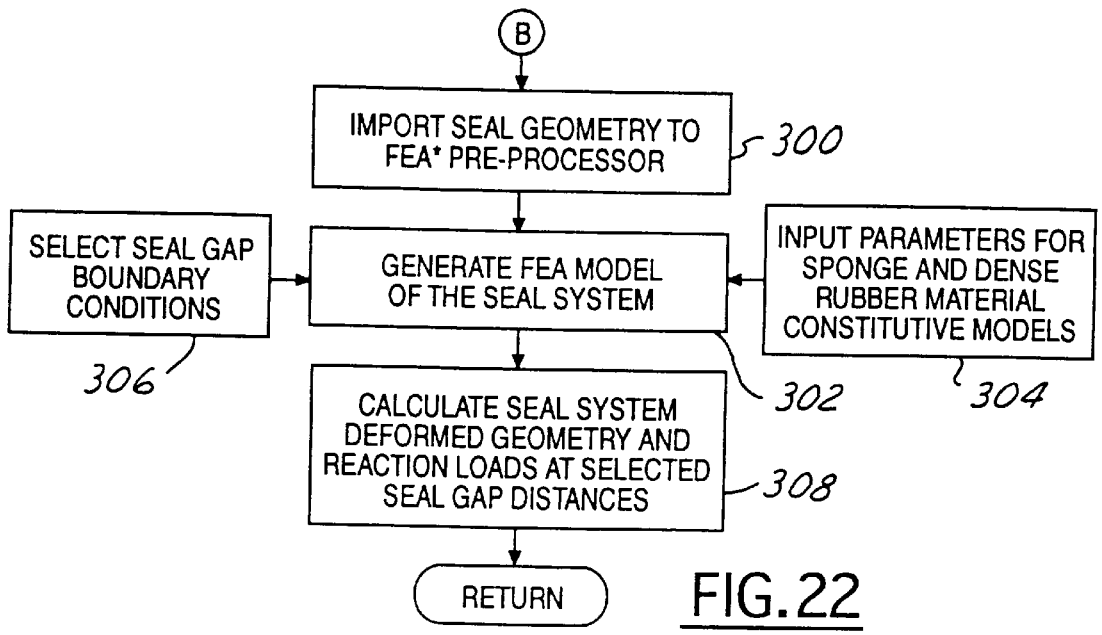
FIG. 22
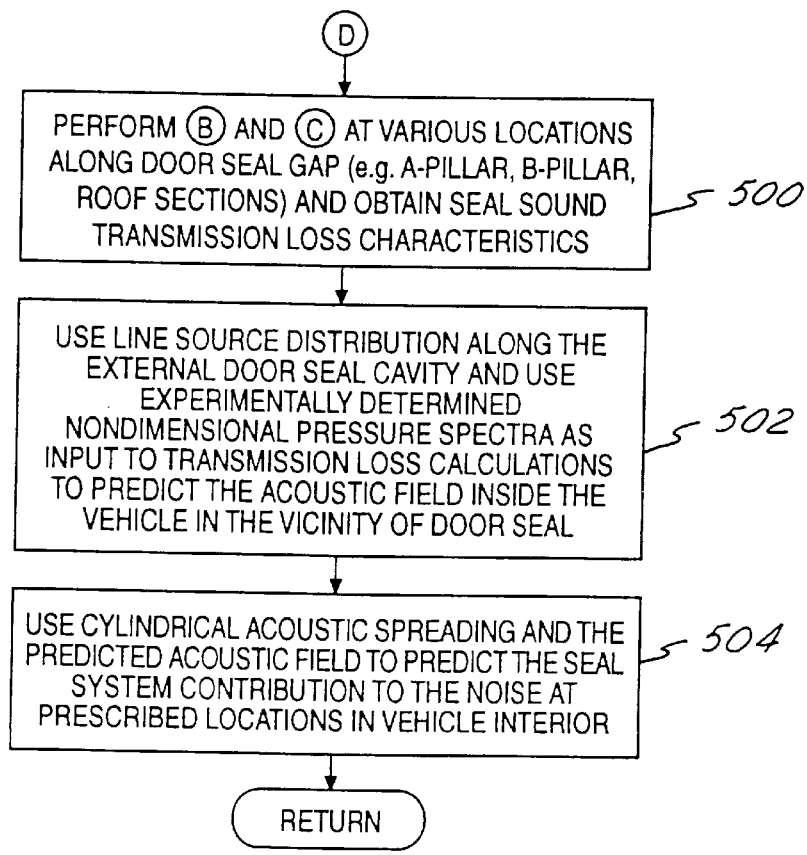
FIG. 24 * FINITE ELEMENT ANALYSIS

METHOD AND SYSTEM FOR DESIGNING VEHICLE DOOR SEALS BASED ON PREDICTED SOUND TRANSMISSION CHARACTERISTICS

FIELD OF THE INVENTION

The present invention relates to vehicle door seals in general, and more specifically to a method and system for designing door seals based on predicted sound transmission characteristics.

BACKGROUND OF THE INVENTION

The interior noise level of an automotive vehicle passenger compartment plays a major role in a customer's perception of overall vehicle quality. Interior noise level therefore has become a major consideration in the design, construction, and assembly of the vehicle body structure, including design of the vehicle door sealing system.

The noise sources generated in the proximity of the exterior body surface, which eventually propagate through various transmission paths into the passenger compartment, have several components: aerodynamically generated noise, termed "wind noise"; noise generated by the tire rolling over the road surface; and noise from the engine and exhaust system. Wind noise is generated mainly on the side glass windows of the doors by the turbulent flow of air around the "A" pillar structures and other recesses and projections in the body surface, such as the outside mirrors and drip rails and is transmitted into the vehicle interior through body panels, side window glass, and the seal gap between the door and DOP (Door Opening Panel). To keep wind noise out of the passenger compartment, a door weatherstrip seal system, perhaps having several layers of sealing bulbs, is typically placed in the seal gap.

Usually, automotive door seals are designed using the "bread board" and other "build and test" procedures. The bread board is a five (5) times oversized representation of the rubber seal cross-section and the sealing surfaces. It consists of two components: a stationary component sculptured out of wood to represent the DOP sheet metal; and, a moveable component to which is attached an oversized rubber seal cross-section. By moving the movable board piece, it is possible to see the seal deformed shape and its contact with the sheet metal when the door is closed. If there is not enough contact area to prevent water leakage, or if an undesirable compressed seal shape is attained, seal design engineers must go back to their drawing board and develop a new design ("build and test" procedure). Since the "bread board" procedure only gives door sealing response locally, vehicle seal designers do not know whether their seal design meets door closing effort, water leakage, and wind noise targets before actually manufacturing the door seal system and testing it on the vehicle. In addition, this procedure is time consuming and expensive.

SUMMARY OF THE INVENTION

The present invention allows prediction of seal system performance in sound transmission before a prototype system is made. Finite element analysis is applied to a preselected seal design to determine seal system deformed geometry, compression load deflection (CLD) response, and sealing contact areas and pressures. A sound transmission loss is then predicted for the preselected design using acoustics, finite deformation rubber elasticity, and steady state harmonic viscoelasticity, which are combined to perform a fully coupled, acoustic/structure interaction analysis. Based upon the predicted sound transmission loss, the preselected seal design is changed according to predefined rules to produce a seal design which can provide a desired sound transmission loss level.

An advantage of the present invention is a door seal design method which does not require expensive and time consuming prototype builds to test a seal design.

Another advantage of the present invention is a door seal design method which predicts door seal sound transmission characteristics.

A feature of the present invention is a door seal design method which uses finite element analysis, acoustics, and the viscoelastic properties of the materials used in the seal construction to perform an acoustic/structure analysis on a preselected door seal design to predict sound transmission loss so that the design can be modified according to predetermined rules to achieve a door seal design providing desired sound transmission characteristics.

BRIEF DESCRIPTION OF THE DRAWINGS

These and other objects, advantages, and features of the present invention will be apparent to those skilled in the art upon reading the following description with reference to the accompanying drawings, in which:

FIG. 22 is a flowchart showing steps for performing a compression load deflection (CLD) analysis comprising a portion of the method of FIG. 20;

FIG. 24 is a flowchart showing steps for determining door seal system contribution to vehicle interior noise level;

DETAILED DESCRIPTION OF THE PREFERRED EMBODIMENT

The presence of an unsteady motion in a fluid medium, and the vibration of a structure coupled with a fluid medium, are two main sources of unpleasant or irritating sound, usually called noise. For most automobile applications, the vibration levels of the radiating structures are typically small and not visible, but these small vibrations can cause significant noise levels within a vehicle passenger compartment.

Sound propagates as a wave and travels at a speed of 340 meters/sec. in air. As sound travels it transports energy which is perceived as sound to the human ear. The normal range of hearing for a human extends from approximately 20 Hz up to 20000 Hz. The human ear is most sensitive to sound in the frequency range from 1 to 5 kHz. The human ear responds more strongly to sound at some frequencies than it does to others. Sound of the same intensity but of different frequencies will not appear to be equally loud.

As sound wave propagates, it disturbs a fluid medium from its equilibrium state. These disturbances are nearly always small. The pressure in a fluid medium at position x and time t has mean and fluctuating parts, and can be written as $$p(x,t) = p(x) + p'(x,t)$$

where $p(x)$ is the mean pressure and $p'(x,t)$ is the fluctuating pressure. The fluctuating part of the pressure causes sound generation.

The sound pressure level (SPL) is a measure of the mean square pressure fluctuation level and is defined as $$SPL = 20 \log [p'_{rms}/p_{ref}]$$

where $p'_{rms}$ is the root mean square of the pressure fluctuations, and $p_{ref} = 20 \times 10^{-6}$ Pascals. Sound transmission loss is defined as follows:

Sound Transmission Loss=10 log (Exterior Sound Power)–10 log (Interior Sound Power)

With a plane wave assumption, sound transmission loss becomes:

$$\text{Sound Transmission Loss} = \text{Exterior SPL} - \text{Interior SPL} - 10\log\frac{A_{interior}}{A_{exterior}}$$

where $A_{interior}$ and $A_{xterior}$ are in the input and output areas of the finite element model.

When $A_{nterior}$ and $A_{xterior}$ are equal, sound transmission loss becomes:

Sound Transmission Loss=Exterior SPL–Interior SPL and the vehicle interior sound pressure level in the vicinity of a door seal can be written as Interior SPL=Exterior SPL–Sound Transmission Loss.

In order to determine the contribution of a door seal system to vehicle interior noise level, exterior SPL and sound transmission loss characteristics of the door seal system must be known. Before discussing the sound transmission loss characteristics of a complex door seal system, simple seal models (such as a circular seal, a square seal, and parallel seal layers) will be discussed to demonstrate the influence of the seal parameters on seal noise transmission characteristics. These parameters include seal material density, seal constitutive model, stress field due to seal compression, seal thickness, separation distance between seal layers, and external and internal cavity shapes.

Figure 1:
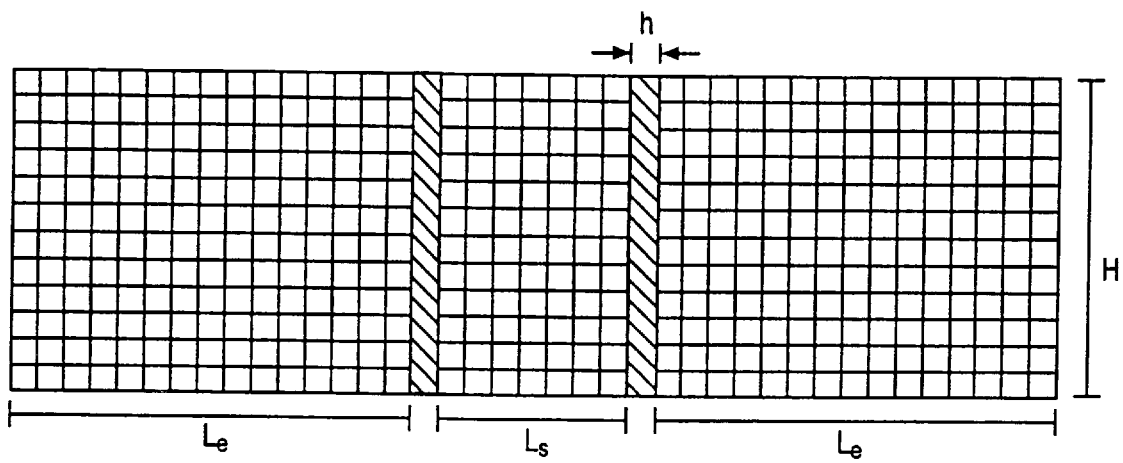
FIG. 1 is a finite element representation of a seal with two layers.

A simple seal model, shown in FIG. 1, consists of two parallel seal layers separated by an acoustic medium. There are two additional acoustic mediums located before and aft of the seal layers. Rigid surface boundary conditions are specified on the exterior acoustic medium surfaces except at the inlet and outlet boundaries. Appropriate boundary conditions are also specified at the interface between seal layer and rigid surface. Prescribing the inlet pressure fluctuating field, this acoustic-structural coupling problem is solved, using techniques known in the art and suggested by this disclosure, to determine the fluctuating pressure field at the outlet boundary which represents the location of the vehicle interior in the vicinity of the door seal.

Figure 2:
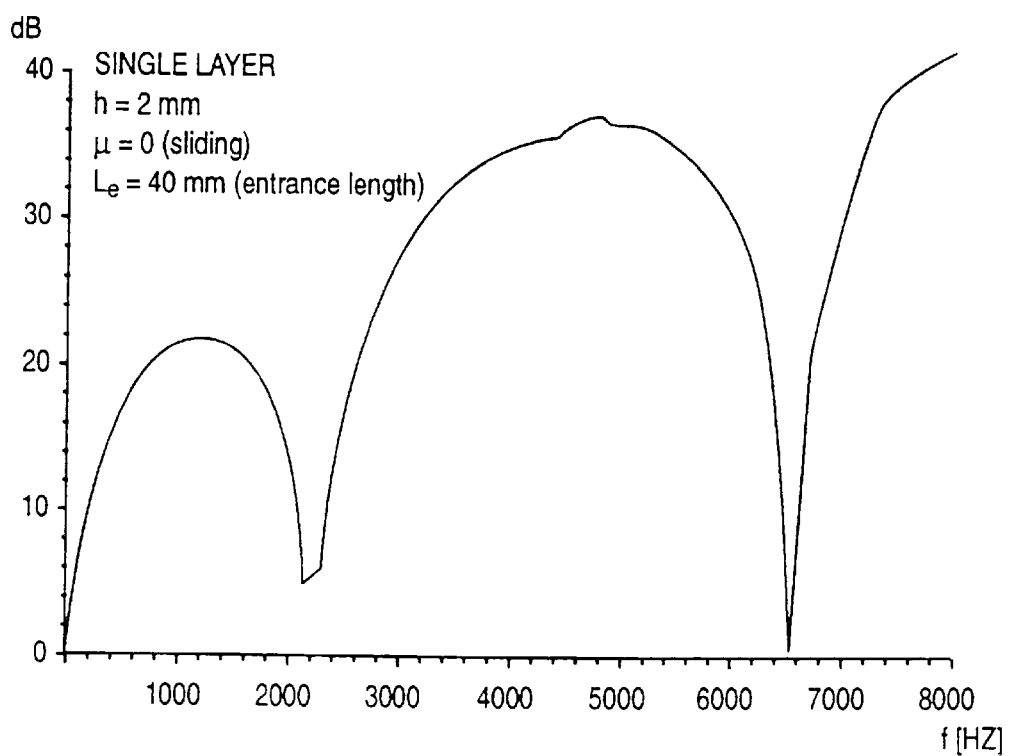
FIG. 2 is graph showing sound transmission loss distribution for a single layer seal.

FIG. 2 shows sound transmission loss distribution of a single seal layer having a seal layer thickness of 2 mm. In this calculation, zero friction was applied at the seal/rigid surface interface, therefore, the sound transmission loss started from zero (rigid body motion) and increased with increasing frequency. When the frequency approaches the first mode of this coupled system, sound transmission loss decreases. The first mode (resonance frequency) occurs when the quarter of an acoustic wavelength coincides with the entrance length $$\lambda/4 = c_o/4f = L_e$$

where λ, $c_o$, $f$, and $L_e$ are the acoustic wavelength, acoustic wavespeed, frequency, and entrance length, respectively. The entrance length, $L_e$, is the distance between the external boundary and the seal layer. The second resonance occurs when the three quarters of an acoustic wavelength matches with the entrance length. These are the only two modes occurring in the frequency range of 8 kHz. The modes appear due to the coincidence between geometric length and acoustic wavelength.

Figure 3:
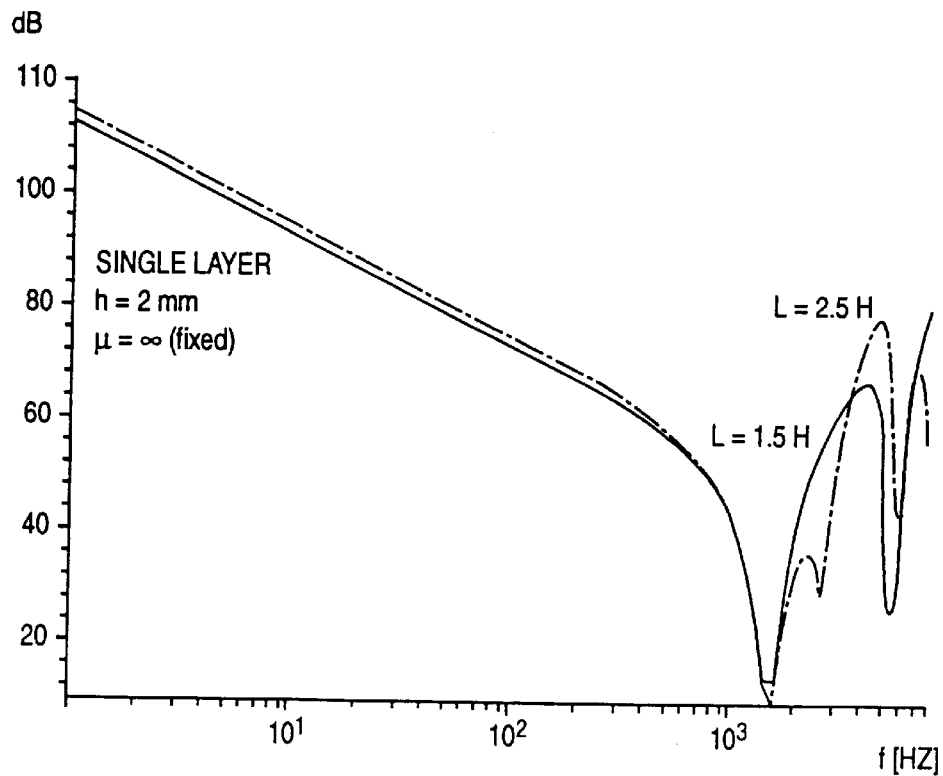
FIG. 3 is a graph showing the sound transmission loss distribution for the single seal model of FIG. 2, but for two different entrance lengths.

FIG. 3 shows the sound transmission loss distribution for the same single seal model, but for two different entrance lengths. As can be seen from FIG. 3, changing the entrance length generates different seal-noise transmission characteristics. By changing the separation distance between seal layers, it is possible to move the modes to desired locations where the exterior power spectral density is not high. This is important since moving the modes from frequency regions where the exterior power spectral density is high will reduce the seal system contribution to the interior noise level significantly without changing the compression load deflection behavior of the seal system, that is, without changing the door closing effort. The present invention provides an analytical method and tool for a door seal system designer to achieve that result.

Figure 4:
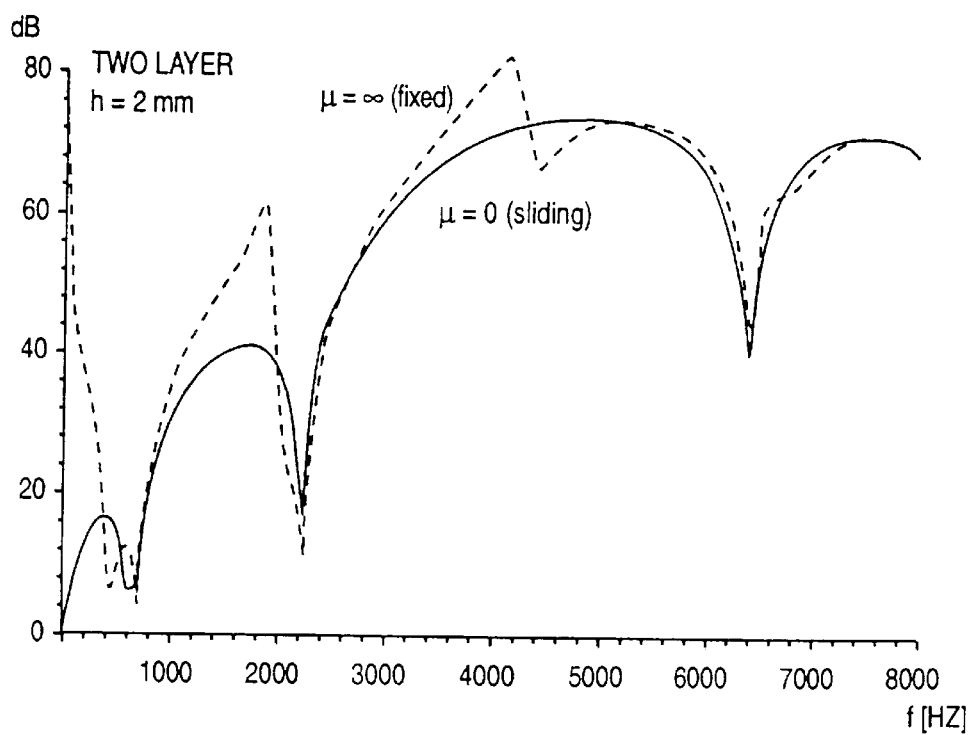
FIG. 4 is a graph showing the sound transmission loss through two seal layers for two different boundary conditions applied at a seal/rigid surface interface.

FIG. 4 displays the sound transmission loss through two seal layers for two different boundary conditions applied at the seal/rigid surface interface. In the first calculation (solid line), no friction was applied at the interfaces between seal layers and rigid surfaces. In the second calculation (dotted line), all the nodes touching the rigid surfaces were fixed. The results indicate that sound transmission loss significantly depends on the interface boundary condition, particularly in the low frequency region.

Figure 5:
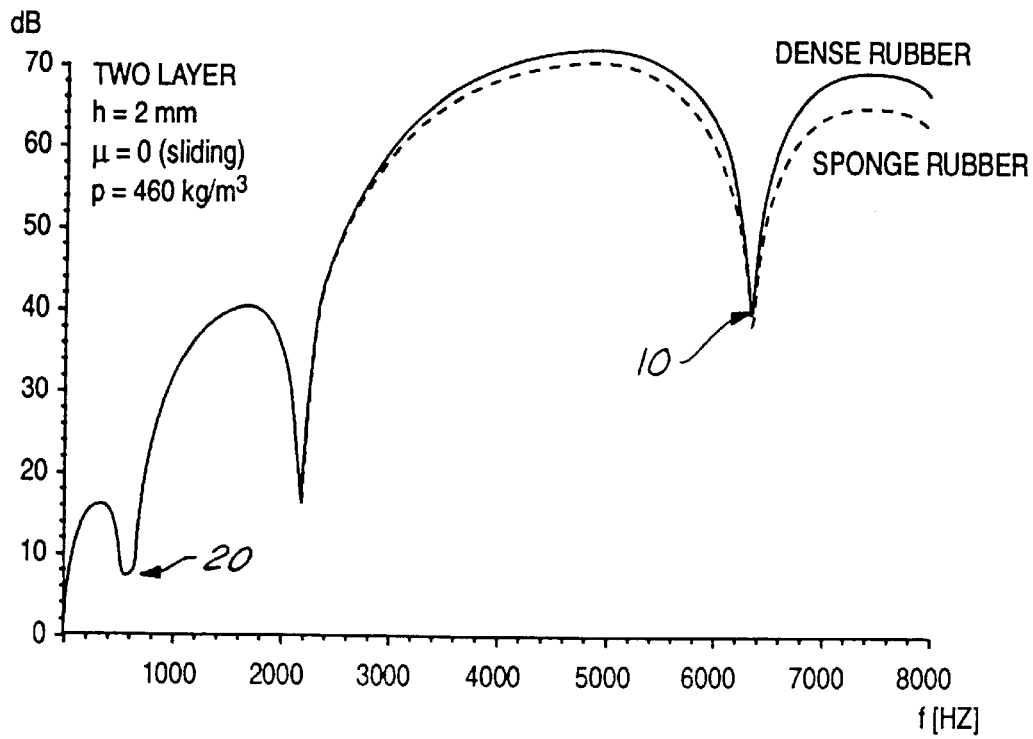
FIG. 5 is a graph showing the sound transmission loss through two seal layers for both dense rubber (solid line) and sponge rubber (dotted line) constitutive models while keeping the seal material density constant.

It is known that seal material density and seal constitutive equations are interrelated. In order to determine the effects of seal material density and constitutive model separately, the seal material density and constitutive equations are artificially separated. FIG. 5 displays the sound transmission loss through two seal layers for both dense rubber (solid line) and sponge rubber (dotted line) constitutive models while keeping the seal material density constant. It is important to note that seal material constitutive behavior has a significant role in determining the statically deformed seal shape: since the deformed seal shape has an effect on noise transmission, the constitutive model therefore has an indirect effect on the noise transmission characteristics of the seal system.

FIG. 5 displays two distinct sets of modes. The first set of modes 10 are associated with the entrance length only and the generation mechanism of these modes was described above. For an entrance length of 40 mm, these modes occur approximately at f=2.12 kHz, and f=6.36 kHz. The other set of modes 20 are associated with the seal material density, seal thickness, and separation distance between seal layers, and they appear in the low frequency range. As is seen in FIG. 5, the seal constitutive model has no effect on the location of the low frequency modes. If a no friction boundary condition is used at the seal/rigid surface interface, and if there are n number of seal layers, there will be n−1 modes in the low frequency range.

Figure 6:
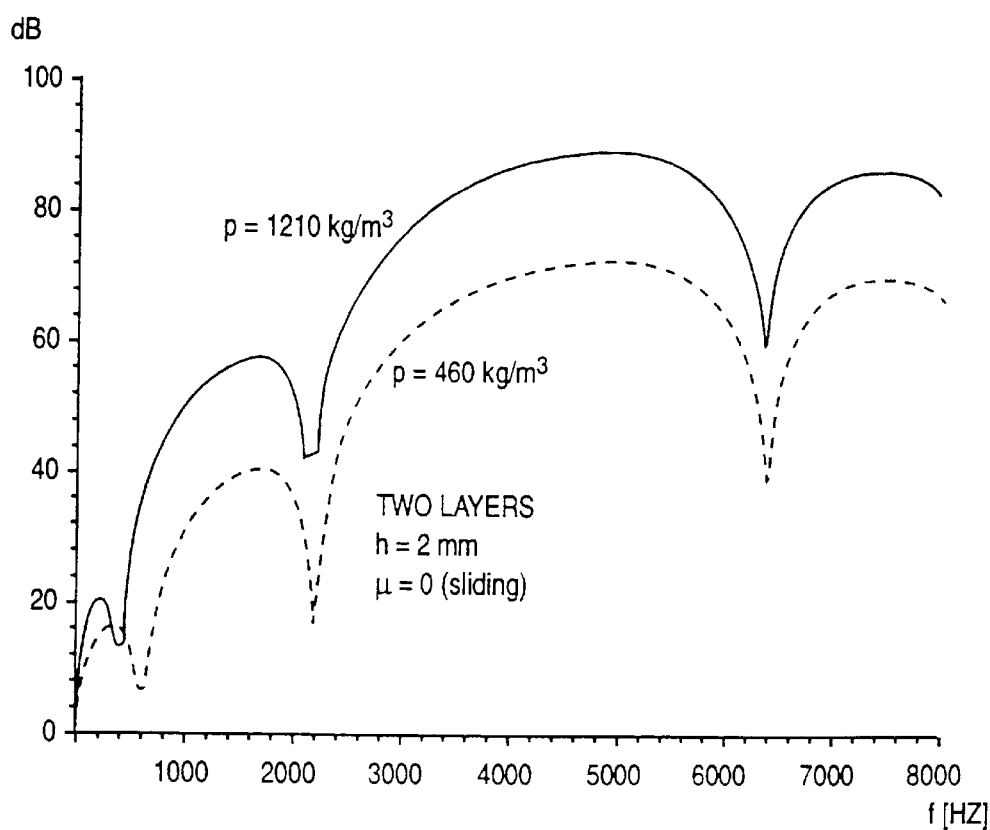
FIG. 6 is a graph showing the effects of the seal material density on sound transmission for both dense rubber (solid line) and sponge rubber (dotted line) materials.
Figure 7:
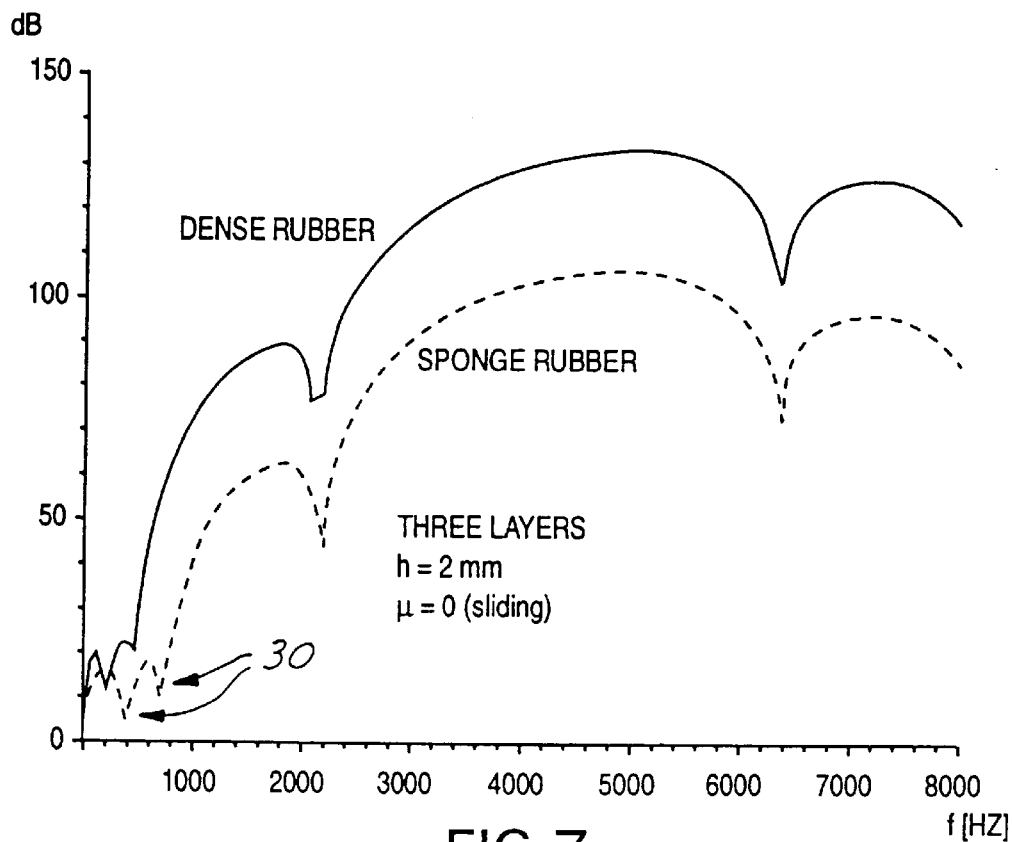
FIG. 7 is a graph showing the sound transmission loss through three seal layers for both dense rubber (solid line) and sponge rubber (dotted line) materials.

FIG. 6 displays the effects of the seal material density on sound transmission for both dense rubber (solid line) and sponge rubber (dotted line) materials. In order to find out only the effect of the seal material density, we used the same constitutive model for both calculations. The results indicate that the seal material density has a very significant effect on sound transmission loss. Increasing seal material density increases the overall sound transmission loss, and it also decreases the locations of seal resonance frequencies (FIG. 6). Typical material densities of dense rubber and sponge rubber are 1210 kg/m³ and 460 kg/m3, respectively FIG. 7 displays the sound transmission loss through three seal layers for both dense and sponge rubber materials. These results indicate the effects of both seal material density and seal constitutive equations. Absence of friction forces at the seal/rigid surface interfaces dictates that sound transmission loss must be zero for zero frequency. The presence of three seal layers creates two resonance frequencies 30 in the low frequency region, consistent with the rule stated above.

Figure 8:
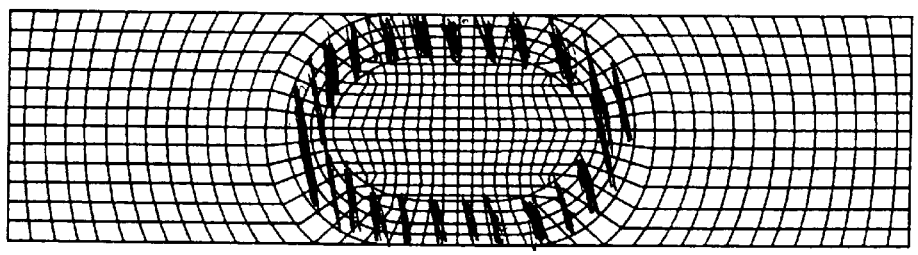
FIGS. 8 and 9 show finite element models of a circular seal and a surrounding acoustic media at compression ratios of 25% and 56%, respectively.
Figure 9:
Figure 10:
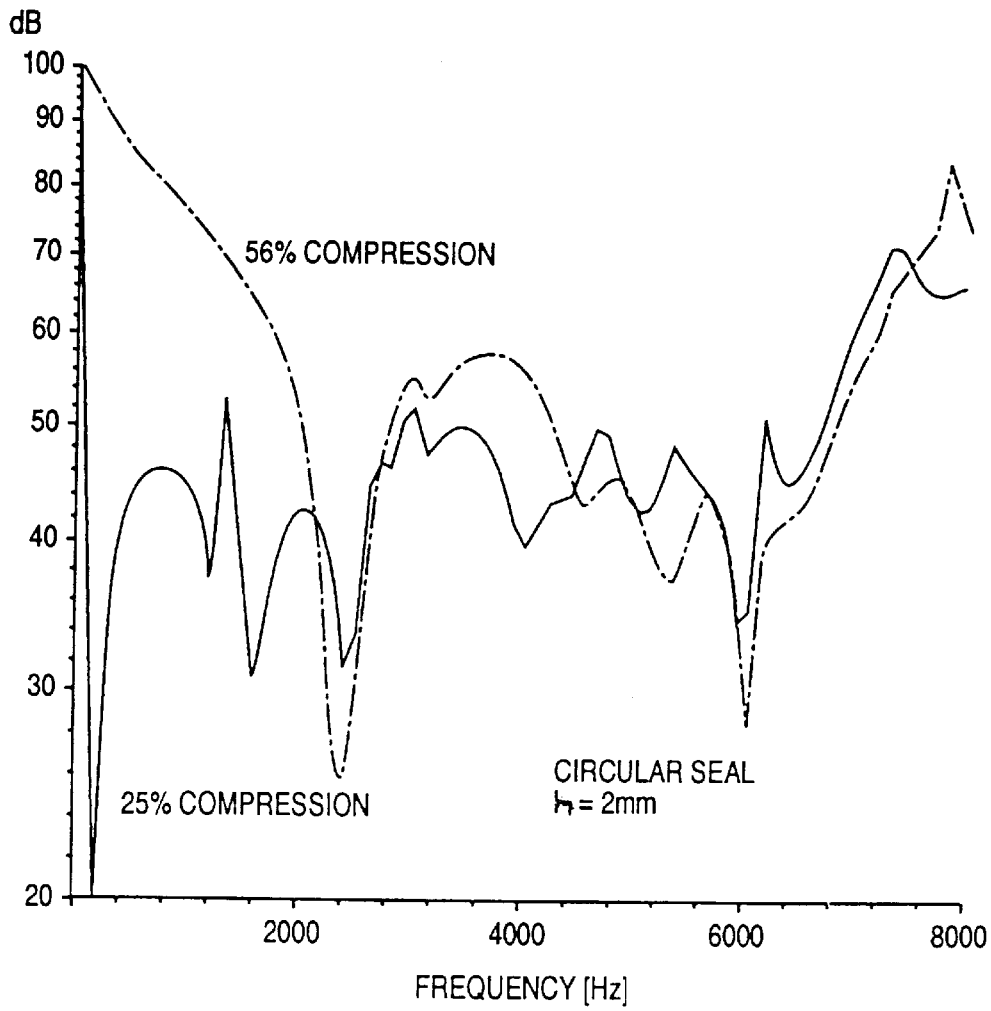
FIG. 10 is graph showing the results of a sound transmission loss versus frequency behavior of the circular seal of FIGS. 8 and 9 under compressions of 25% (solid line) and 56% (dotted line)
Figure 11:
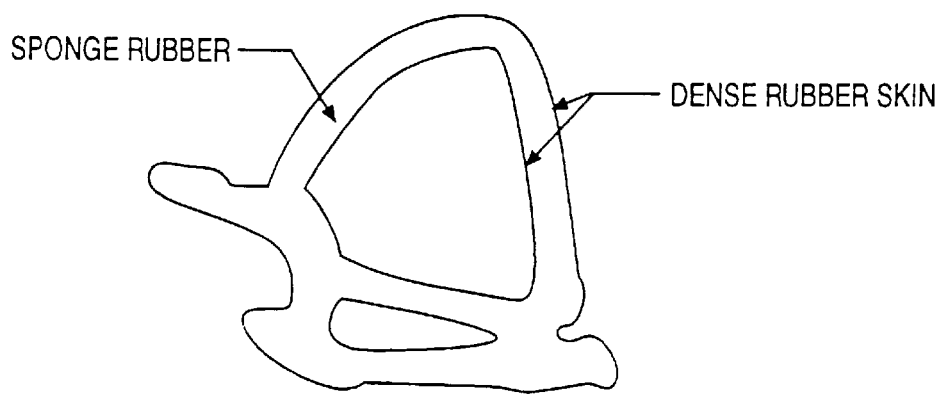
FIG. 11 is a cross-sectional view of a door seal showing use of both dense rubber material for an outer skin of the seal and a sponge rubber material for the body of the seal.

In order to study the effects of seal compression on seal system sound transmission, a circular hollow seal of undeformed outer diameter of 16 mm and 2 mm thickness was subjected to finite element analysis for diametrical compression ratios of 25% and 56%. The finite element models of the circular seal and surrounding acoustic media at compression ratios of 25% and 56% are depicted in FIGS. 8 and 9. The results of the sound transmission loss versus frequency behavior of the circular seal under compressions of 25% (solid line) and 56% (dotted line) are plotted in FIG. 10. The results indicate that seal system noise transmission behavior is sensitive to the state of compression of the seal.

It has been determined that the presence of a third seal layer decreases the sound transmission since the sound transmission mechanism is the seal layer vibration and the presence of an additional seal layer reduces the vibration level of the seal layer interacting with the vehicle interior acoustic cavity.

In FIG. 1, a door seal design can use both dense rubber material, for an outer skin of the seal, and a sponge rubber material for the body of the seal.

Figure 12:
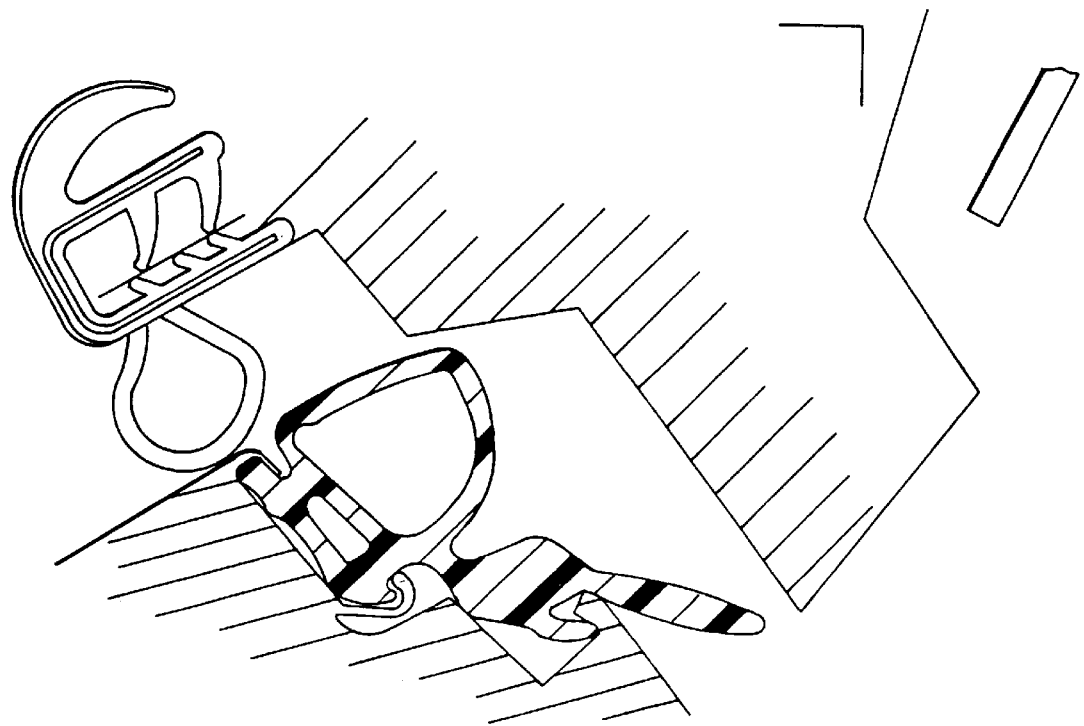
FIG. 12 is a cross-sectional view of a door seal in the A-pillar area of an automobile having three seal layers.
Figure 13:
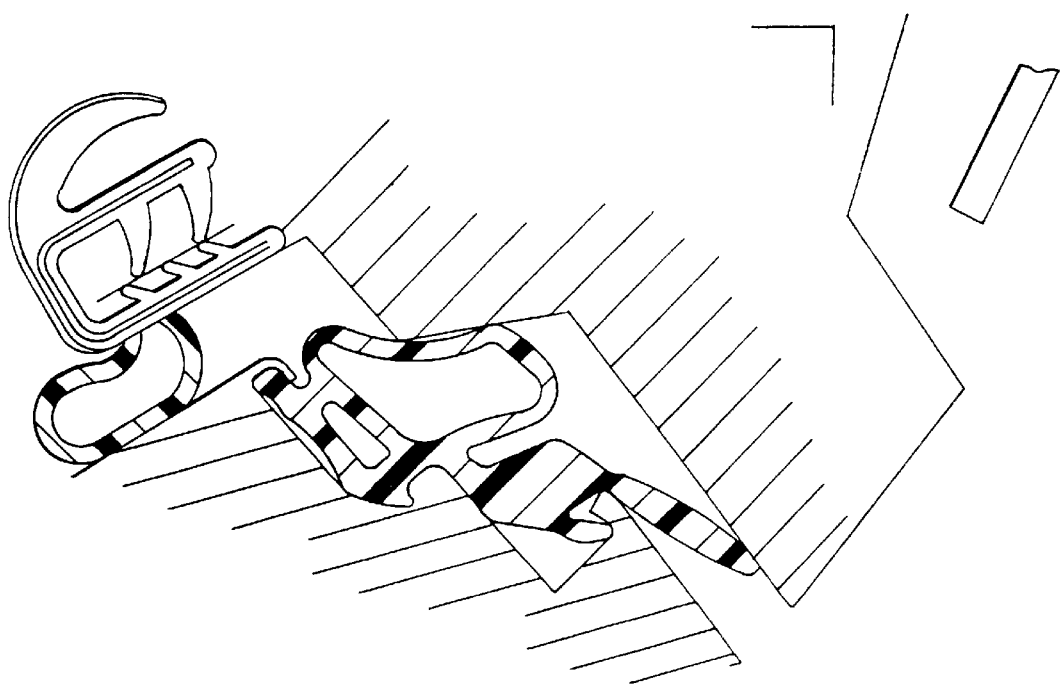
FIG. 13 is a cross-sectional view similar to FIG. 12 but showing a deformed seal geometry.
Figure 14:
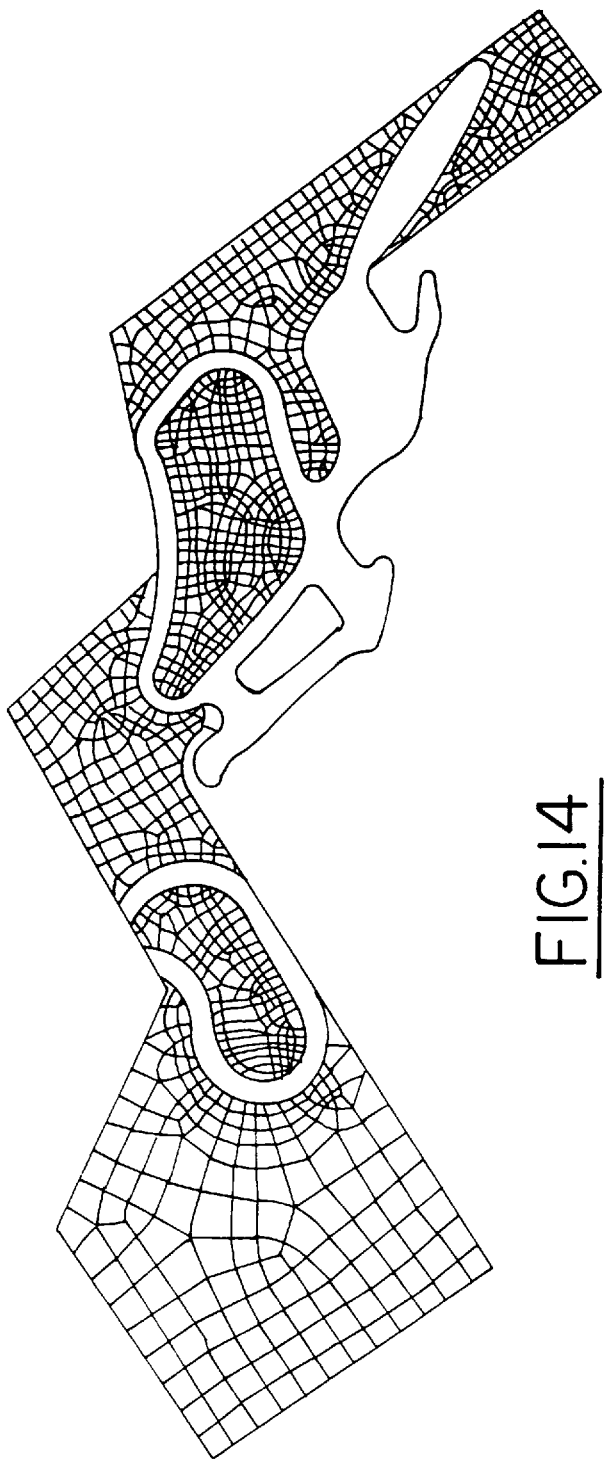
FIG. 14 is a meshed acoustic medium model based upon the deformed seal geometry of FIG. 13.

Using the simple seal models described above, the effects of the individual parameters on noise transmission through a seal system have been determined. A set of design rules have been developed from the above analysis, and the rules have been tested on actual complex seal geometries. FIG. 12 shows the cross-section of one such seal in the A-pillar area of an automobile. This door seal system has three seal layers: the cutline, primary, and secondary seals. The seal system was first compressed to obtain a deformed seal geometry (FIG. 13), and a meshed acoustic medium model was established based upon the deformed seal geometry (FIG. 14). Rigid surface boundary conditions were set on the exterior surfaces of the acoustic mediums except at the inlet and outlet boundaries. Prescribing the external pressure fluctuations at the inlet boundary, this seal/acoustic coupling problem was then solved using the an acoustic/rubber finite element modeling procedure, described further below, to obtain a sound transmission loss distribution through the desired frequency range of 10 KHz.

Figure 15:
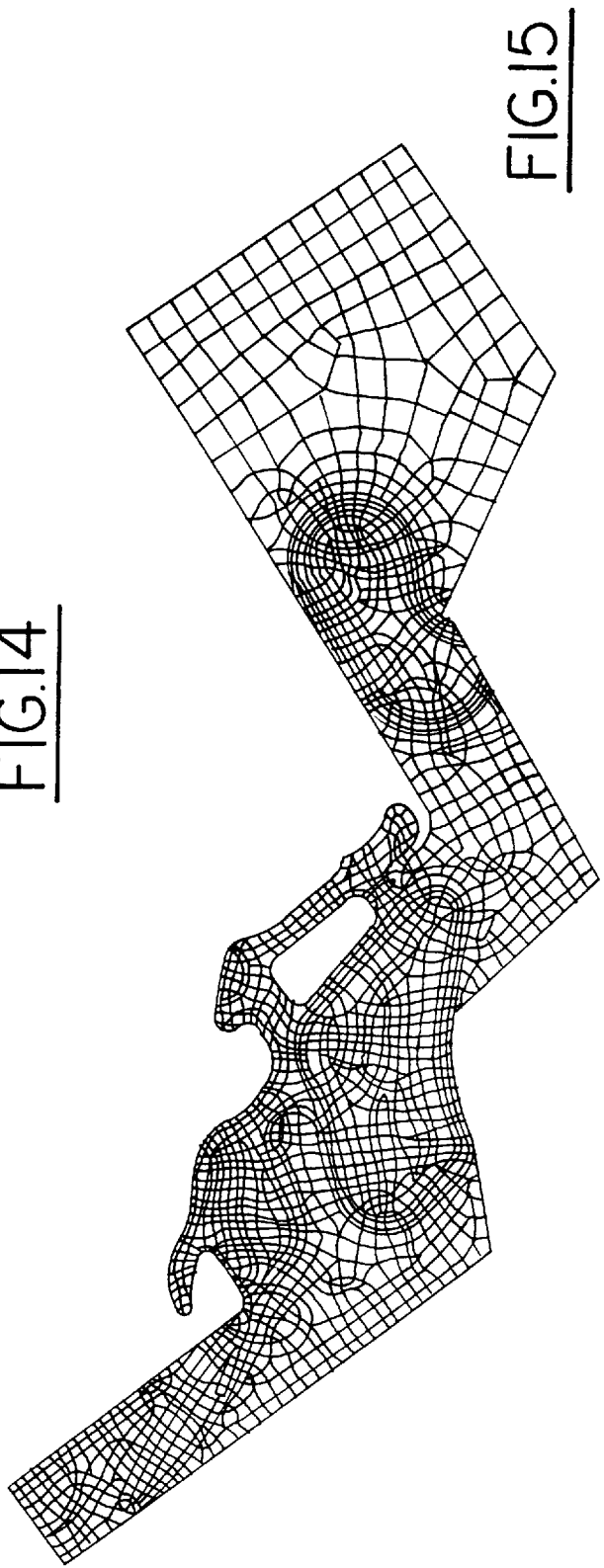
FIG. 15 shows a finite element model similar to FIG. 14 but in which the secondary seal region was replaced with an acoustic medium to determine the secondary seal effect on sound transmission loss characteristics.
Figure 16:
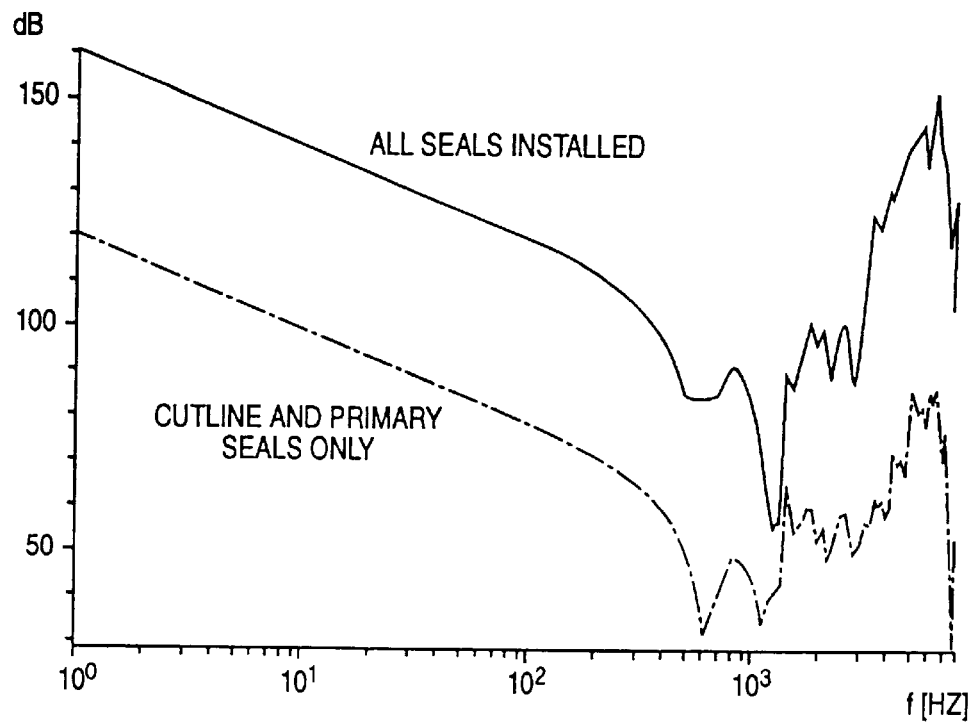
FIG. 16 is a graph showing the sound transmission loss effects of removing the secondary seal.

Another model was made in which the secondary seal region was replaced with an acoustic medium to determine the secondary seal effect on sound transmission loss characteristics. FIG. 15 shows the finite element model for this case. The results indicate that the presence of secondary seal increases the sound transmission loss significantly (FIG. 16).

Figure 17:
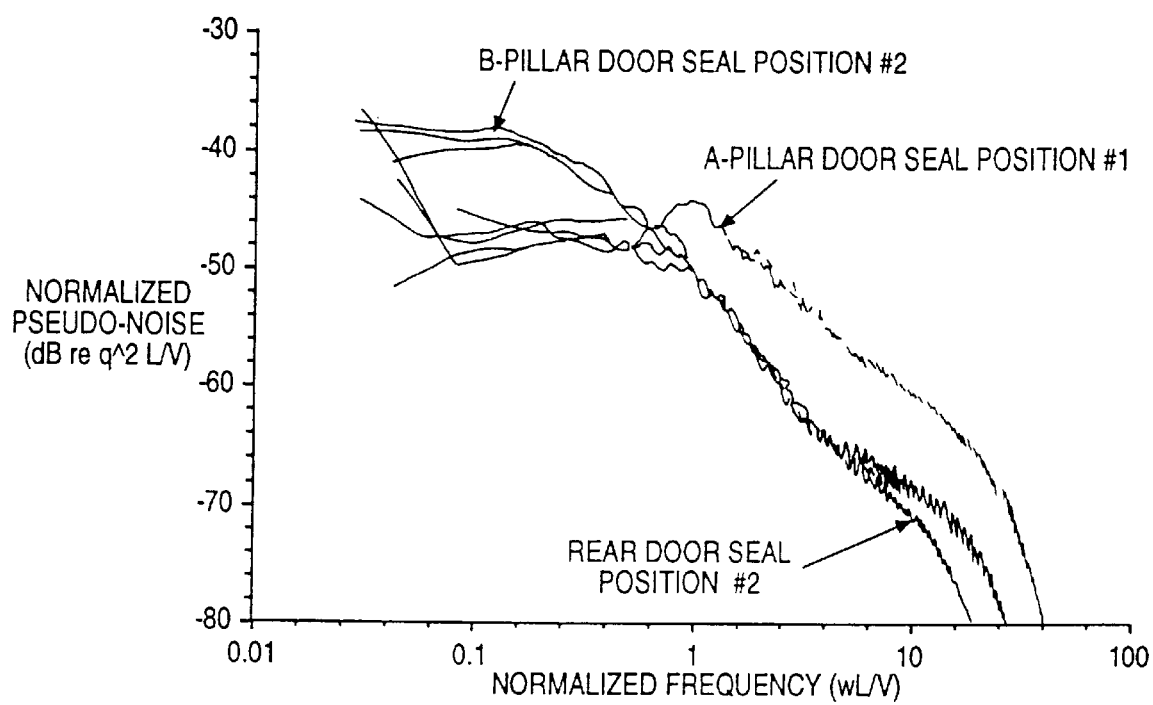
FIG. 17 is a graph showing a nondimensionalized pressure spectra acting on the door seal gap.

In order to determine the door seal system contribution to the vehicle interior noise level, an external pressure fluctuations field in an external door seal gap is needed. FIG. 17 shows a nondimensionalized pressure spectra acting on the door seal gap. This spectra was used as an input to the FEA model and predicted the door seal system contribution to the vehicle interior noise level. The data was obtained from measurements of fluctuating components of pressure acting along the door seal cavity. These measurements were taken with 3 mm diameter microphones.

Figure 18:
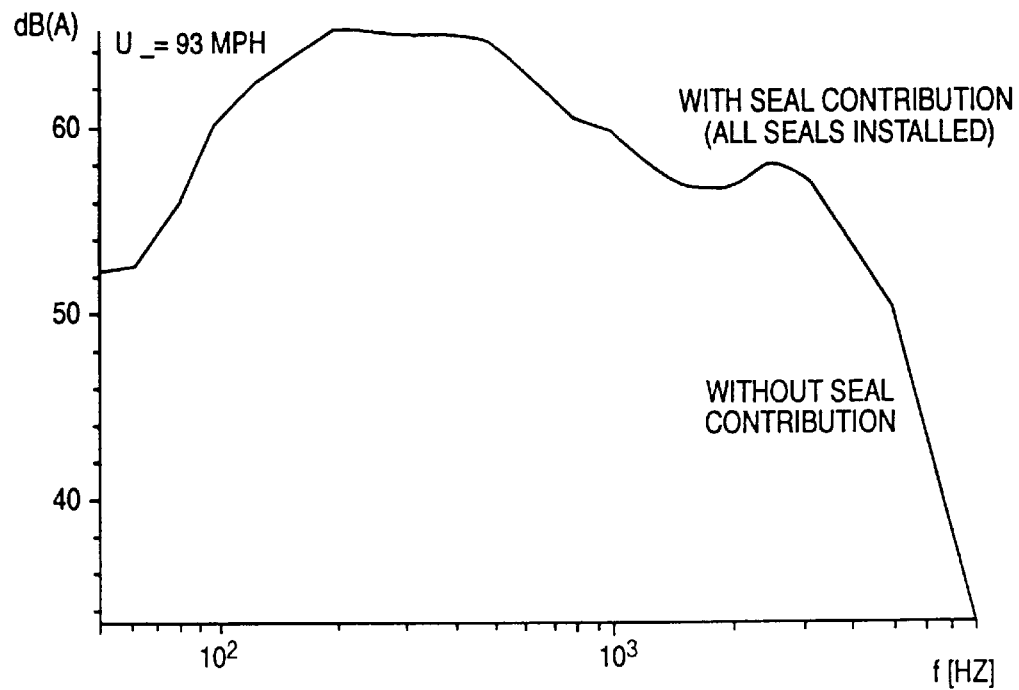
FIG. 18 is a graph showing predicted SPLs at a driver's ear for a selected door seal design with and without door seal contributions to the SPLs.
Figure 19:
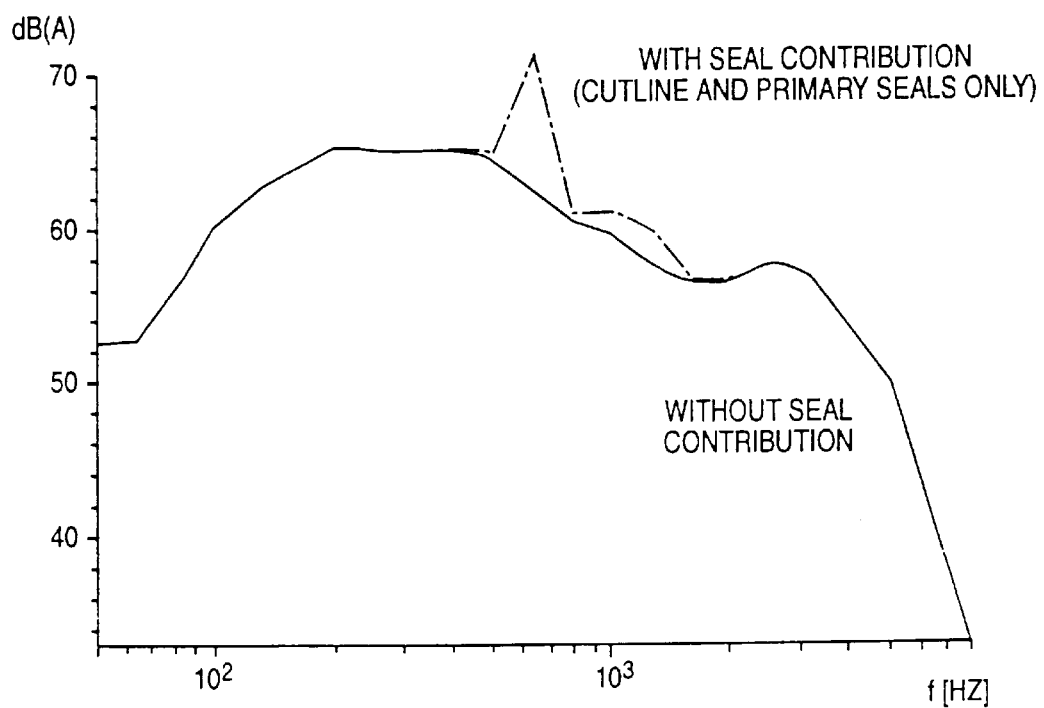
FIG. 19 is a graph showing predicted SPLs at a driver's ear for a selected door seal design with only the cutline and primary seals present in the door seal.

A cylindrical source distribution is preferably used along the A-pillar, B-pillar (above belt line), and roof seal sections, and cylindrical spreading is assumed from these source distribution to the vehicle interior to calculate the seal system sound pressure level contribution at the driver's ear location. FIG. 18 shows the results of predicted seal system plus side glass contributions to the SPL at the driver's ear. A wind noise modeler is used to calculate the side glass contribution. The wind noise modeler preferably is similar to that disclosed in U.S. Pat. No. 5,568,404 (Strumolo), assigned to the assignee of the present invention and incorporated by reference herein. The wind noise modeller is used to generate the SPL of the driver's ear when the sound transmission through door sealing system is not considered. Having this baseline SPL makes it possible to highlight the relative importance of the door sealing system for vehicle interior noise predictions due to wind noise. Wind tunnel experiments performed on different class of vehicles with taped door sealing systems can also be used to generate the baseline SPL information without the need of the wind noise modeller. FIG. 18 shows the results with and without the door seal contribution. As can be seen from FIG. 18, the door seal system does not contribute to the SPL at the driver's ear when three seal layers seal are used in the door seal system design. When there are only the cutline and primary seals present, the door seal system contributes significantly to the vehicle interior noise level in the frequency range from 500 Hz to 1500 Hz (see FIG. 19).

Door seal system design rules can be extracted from the above discussion. The key factors affecting the noise transmission through door seal system are:

External and internal door cavity shapes;

Seal material density; and

Seal Compression.

Seal material or mass density has a major role on noise transmission through seal system. Increasing seal material density decreases the resonance frequencies and increases the overall sound transmission loss. The seal-rigid interface boundary condition has a significant effect on noise transmission in the low frequency range. This structure-acoustic coupling problem has three distinct types of resonant frequencies. The first set of modes are associated with seal material density, deformed seal geometry, and separation distance between seal layers, and they appear in the low frequency range for the typical production seal dimensions and separation distances. The second set of modes are associated with only the external door cavities and appears in the high frequency range. The locations of these modes depend on the geometric dimensions of the external door cavities. The third set of modes are associated with the internal cavity shapes, and as in the second set of modes, they only depend on the geometric dimensions of the internal acoustic cavities between seal layers. Changing the separation distance between seal layers changes the sound transmission characteristics so that it is possible the change the locations of the resonance frequencies by simply changing the separation distances between seal layers. This feature makes it possible to move the modes from locations, where the input (external door/seal cavity) sound spectral density level is high, in order to reduce the seal system contribution to the vehicle interior noise level. Increasing the separation distance increases the locations of resonance frequencies. Using this method, the noise transmission loss characteristics of a vehicle door seal system can be calculated, and the seal system contribution to the vehicle interior noise level can be predicted.

Figure 20:
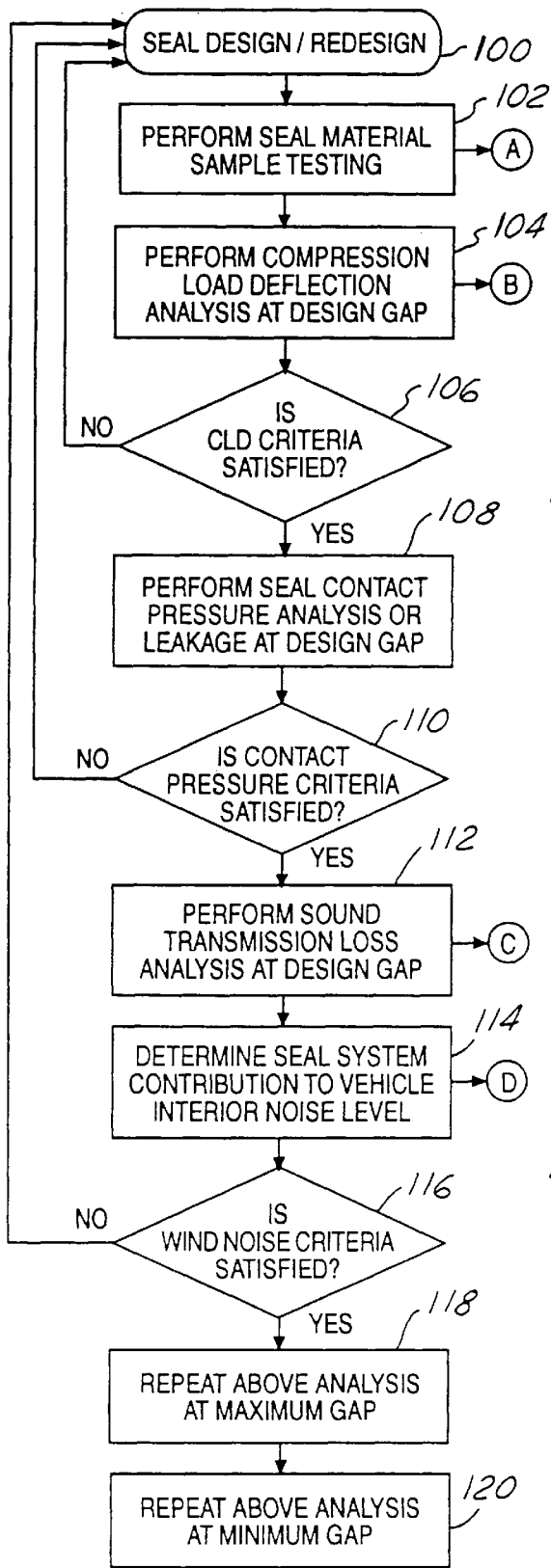
FIG. 20 is a flowchart according to the present invention for designing a vehicle door seal system.
Figure 21:
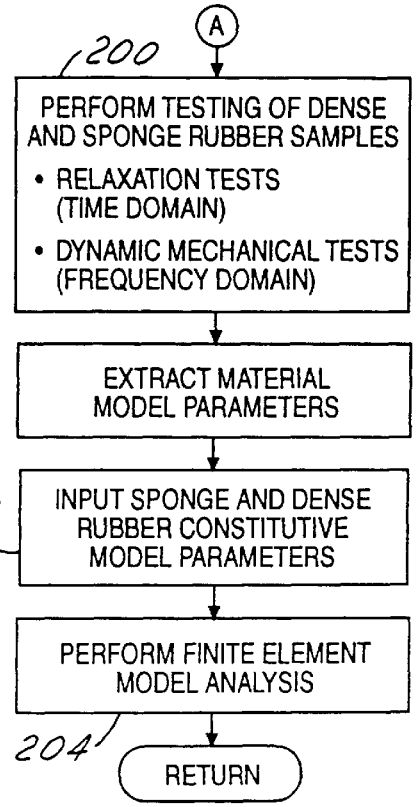
FIG. 21 is a flowchart showing constitutive modeling steps of a comprising a portion of the method of FIG. 20.

Turning now to FIG. 20, a flowchart for a preferred method according to the present invention is shown. Beginning in box 100, a seal design is selected, including the seal material. Next, in box 102, sponge and dense rubber constitutive model parameters are determined. This analysis takes into consideration the nonlinear elastic and viscoelastic finite deformation behavior and the mass densities of the dense rubber and sponge rubber materials used in seal construction (FIG. 21). The constitutive parameters for the steady harmonic analysis of pre-strained viscoelastic materials implemented in the finite element analysis can be determined in accordance with known methods, such as described in Morman, Jr., K. N., and Nagtegaal, J. C., "Finite Element Analysis of Sinusoidal Small-Amplitude Vibrations in Deformed Viscoelastic Solids. PART I: Theoretical Development", International Journal for Numerical Methods in Engineering, 19, pp 1079–1103 (1983). The purpose of the material testing in box 102 is to determine the material parameters (constants and functions) which appear in constitutive equations. Such equations are used to represent the elastic and viscoelastic behavior of materials for arbitrary strain or loading histories. The constitutive model steps are shown in FIG. 21. In box 200, testing of various rubber samples, including dense and sponge rubber samples, is accomplished by performing relaxation tests in the time domain and dynamic mechanical tests in the frequency domain. The results of these tests are translated into constitutive model parameters in box 202 through a process known to those skilled in the art and suggested by this disclosure. Finally, a finite element model is developed in box 204.

Returning to FIG. 20, a compression load deflection (CLD) analysis, box 104, is preferably performed for a selected seal gap in order to determine seal deformed geometry which is necessary to compute the seal sound transmission loss characteristics. This analysis, as seen in the flowchart of FIG. 22, starts with seal geometry model import to an FEA pre-processor (box 300). A finite element analysis (FEA) model of the seal system (box 302) can be generated by using the sponge and dense rubber constitutive models (box 304) described above, and predetermined seal gap boundary conditions (box 306) in accordance with the selected door seal system design. From the FEA model, seal system deformed geometry, as well as reaction loads at different seal gap distances (compression load deflection behavior) can be obtained by performing finite element analysis of the model. The deformed geometry represents the shape of the door seal system when the vehicle door is closed.

The seal system deformed geometry and the reaction loads are then compared to predetermined deflection load criteria (diamond 106, FIG. 20) to determine whether the door seal system meets a predefined compression load deflection criteria based upon the material properties and the geometry of the door seal system. If the door seal system does not meet the compression load deflection criteria, the door seal system is redesigned, as represented by arrow 106, by modifying the material and/or geometry, or other seal system parameters. The steps in boxes 102 (seal material sample testing), box 104 (CLD analysis), and diamond 106 are performed again until the door seal system meets the predefined compression load deflection criteria.

After the door seal system satisfies the CLD criteria, a seal contact pressure analysis is performed (box 108) to determine whether the door seal system meets a predefined seal contact pressure criteria based upon the seal system material properties, the geometry configuration of the seal system, and other parameters.

If the door seal system does not meet the seal contact pressure criteria, the door seal system is redesigned, as represented by arrow 110, by modifying the material and/or geometry, or other seal system parameters. The steps in boxes 102 (seal material sample testing), box 104 (CLD analysis), and diamond 106 are performed again, as are the steps in box 108 (seal contact pressure analysis) and diamond 110, until the door seal system meets both the predefined CLD criteria and the predefined seal contact pressure criteria.

Figure 23:
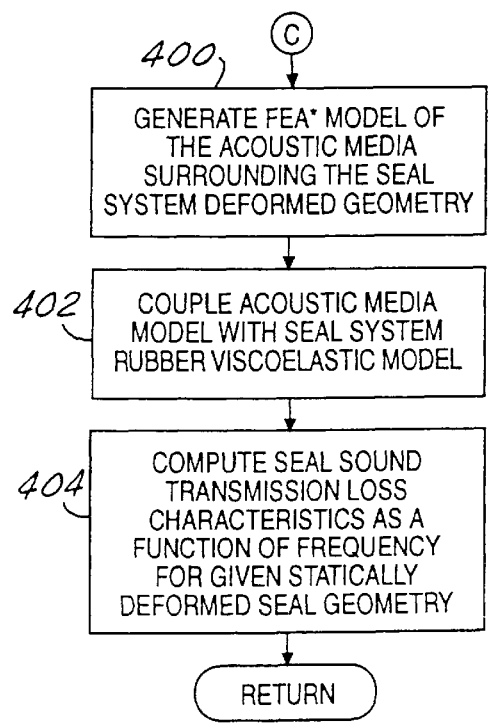
FIG. 23 is a flowchart showing sound transmission loss prediction for a selected seal gap in a vehicle door seal system.

At box 112 in FIG. 20, sound transmission loss at a selected seal gap is performed. As better seen in FIG. 23, an FEA model of the acoustic media surrounding the seal system deformed geometry is first generated (box 400). In box 402, the acoustic model is then coupled with the door seal system viscoelastic model, generated in box 204 of FIG. 21 to provide a fluid-structure interaction analysis model. This model is then used to compute door seal system sound transmission loss characteristics as a function of frequency (box 404).

Figure 25:
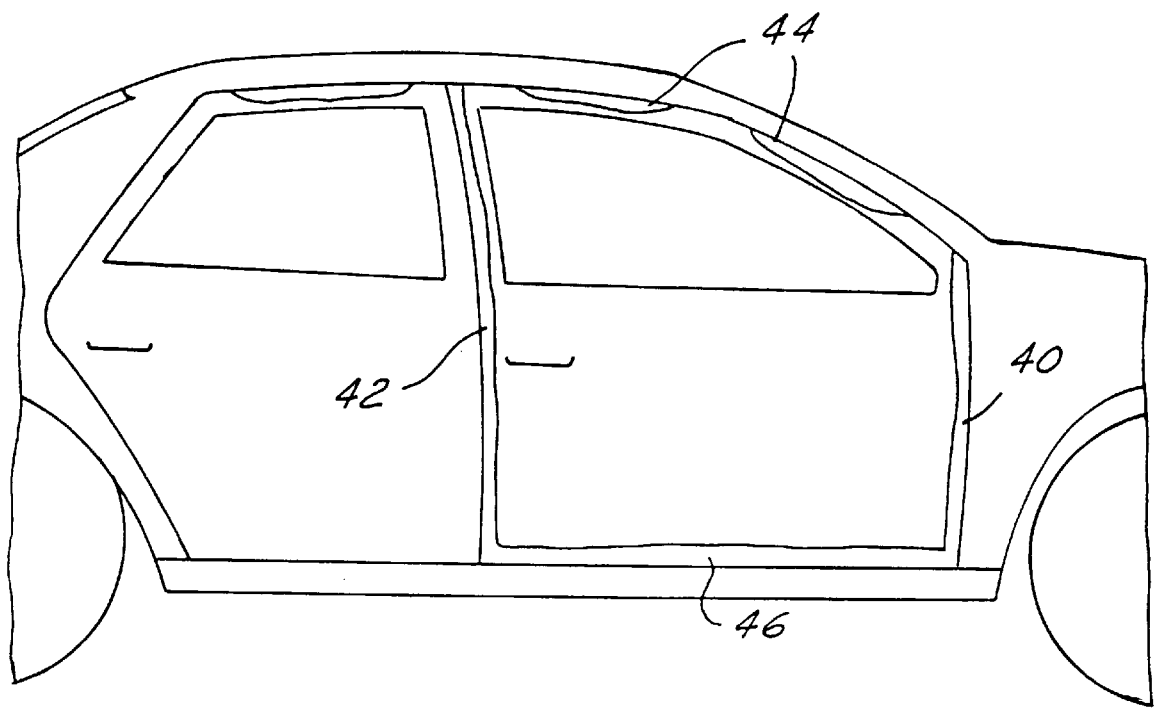
FIG. 25 is a side view of an automotive vehicle showing various locations along the door seal gap upon which sound transmission loss analysis is performed.

When the seal system sound transmission loss has been determined, the door seal system contribution to vehicle interior noise level is then determined in box 114 (FIG. 21). At box 500 of FIG. 24, door seal system sound transmission loss analysis is performed at various locations along the door seal gap. These locations include, in FIG. 25, an A-Pillar section 40, a B-Pillar section 42, and a roof section 44. Other sections may be included, for example a floor section 46. The sound transmission loss behavior of the vehicle door seal system is preferably obtained for frequencies up to 10 kHz.

In order to determine the door seal system contribution to the vehicle interior noise level, it is necessary to know the external pressure fluctuation field in the external door seal cavity. Actual data for an external pressure fluctuation field in the door seal cavity can be experimentally obtained for each proposed door seal system design. However, an advantage of the present invention is use of a nondimensionalized pressure spectra field. Preferably, to determine the unsteady pressures experienced in the door seal cavity, various classes of vehicles can be placed in a wind tunnel to determine the fluctuating pressure field acting on the door seal cavity. Small electric microphones (3 mm in diameter) can be used to capture the fluctuating pressure spectra in the door seal cavity. Preferably, at least three tunnel wind speeds are used in order to nondimensionalize the pressure spectra. The nondimensionalized pressure spectra are then used as an input to the seal sound transmission loss results and the seal system contribution to the vehicle interior noise level are predicted. In the process of predicting the seal system contribution to the vehicle interior noise level, cylindrical source distribution along the A-pillar, B-pillar (above the belt line), and roof seal sections is used, and cylindrical spreading from these source distribution to the vehicle interior is assumed (FIG. 24, boxes 502, 504).

Figure 26A:
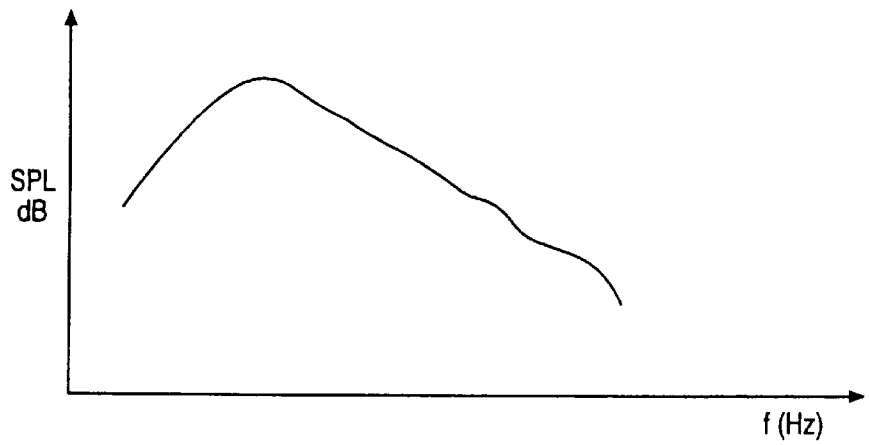
FIGS. 26A–26C are graphs collectively showing prediction of a door seal system contribution to vehicle interior noise level by subtracting the sound transmission loss from the interior SPL.
Figure 26B:
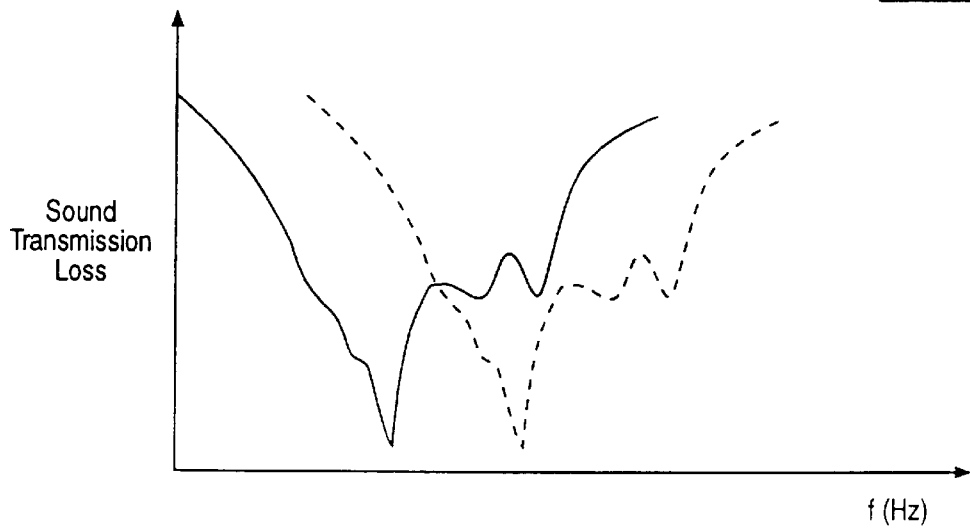
Figure 26C:
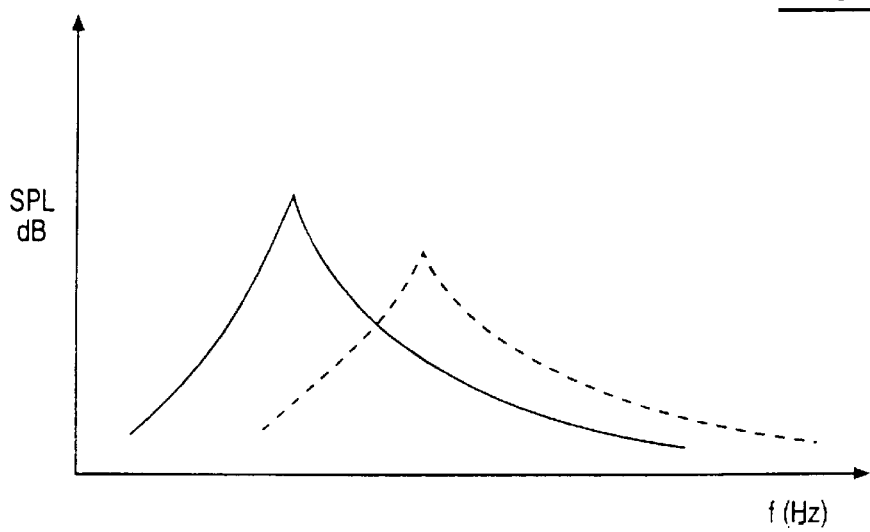

The seal system contribution (FIG. 26C) to the vehicle interior noise level is predicted by subtracting the sound transmission loss (FIG. 26B) from the exterior SPL at an exterior door seal cavity (FIG. 26A). The solid line in FIGS. 26B and 26C represents a first selected door seal system design which resulted in an undesirable noise "spike", identified by reference number 50, at a low frequency. The frequency and magnitude of this "spike" can be modified by changing the seal system design, according to the present invention as discussed above, to produce the door seal system contribution to vehicle internal SPL, which is represented by the dotted line in FIG. 26C.

Figure 27A:
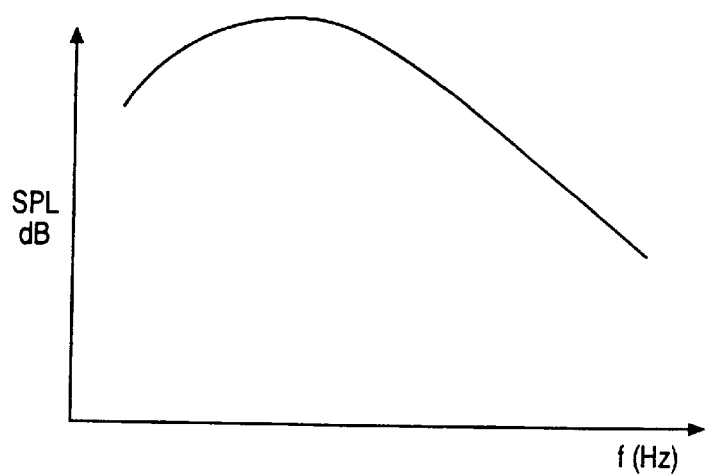
FIGS. 27A–27C are graphs showing reduction in interior noise level due to changing the door seal system material from a sponge rubber (solid line) to a dense rubber (solid line).
Figure 27B:
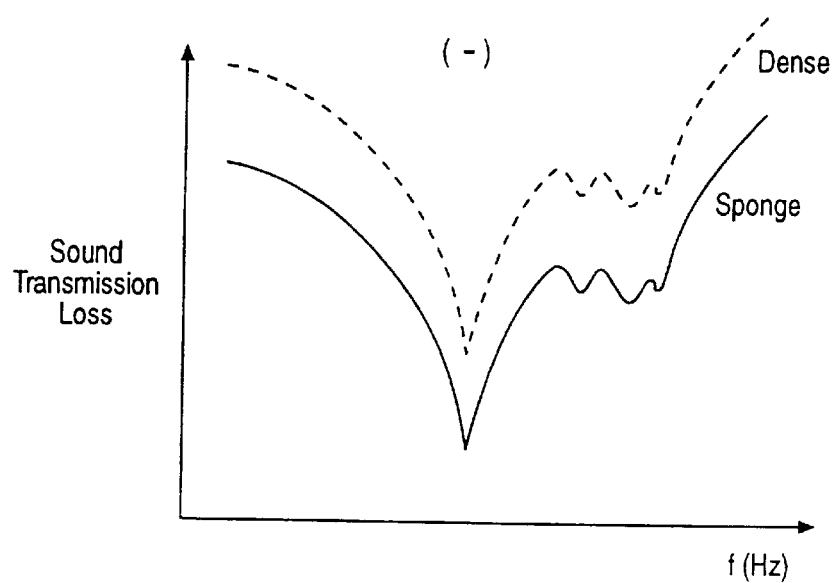
Figure 27C:
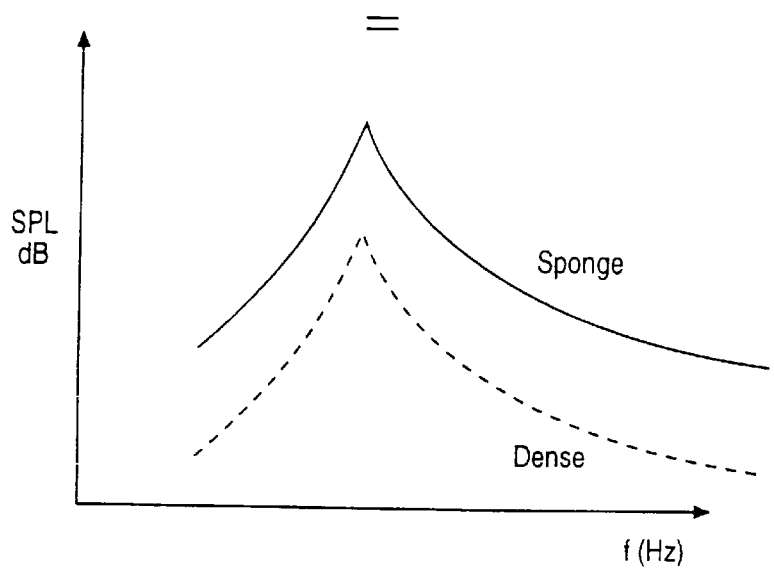

FIGS. 27A–27C represent a reduction in interior noise level due to changing the door seal system material from a sponge rubber (solid line) to a dense rubber (solid line). FIG. 27A shows the vehicle exterior noise level at the door seal cavity. FIG. 27B shows the sound transmission loss determined as described above, and FIG. 27C shows a reduction in door seal system contribution to internal SPL resulting from the changed material.

Although the preferred embodiment of the present invention has been disclosed, various changes and modifications may be made without departing from the scope of the invention as set forth in the appended claims.

What is claimed is:

1. A method for designing a door seal system based upon a predicted contribution of the door seal system to sound pressure levels (SPLS) within an automotive vehicle due to wind noise, the method comprising the steps of:

(a) storing in a memory of a programmable digital computer system a first set of data representing mass density and nonlinear viscoelastic properties of materials used in construction of the door seal system;

(b) storing into the memory a second set of data representing a predefined geometry for the door seal system and a geometry for a plurality of sealing surfaces in contact with the door seal system, and computing an acoustic medium geometry based upon a deformed seal geometry;

(c) storing into the memory a third set of data representing a pressure spectra for an air flow over an external seal gap;

(d) computing a fourth set of data, based on the first, second, and third sets of data, representing a door seal system contribution to the SPLs within the vehicle due to sound radiated by the seal gap;

(e) displaying the fourth set of data on the computer system;

(f) comparing the fourth set of data to a predefined wind noise criteria;

(g) changing the door seal system design by modifying the first and second sets of data if the fourth set of data does not meet the wind noise criteria; and (h) redoing steps (d) through (g) until the fourth set of data meets the predefined wind noise criteria.

2. A method according to claim 1 wherein the second set of data includes a predetermined number of sealing bulbs, a shape for each of the sealing bulbs, a spacing distance between each of the sealing bulbs, a predetermined shape for an acoustic media partially surrounding the sealing bulbs, and a predetermined shape for a plurality of sealing surfaces partially surrounding the sealing bulbs.

3. A method according to claim 1 wherein the first set of data includes data representing mass density and nonlinear viscoelastic properties of dense rubber and sponge rubber.

4. A method according to claim 1 wherein the first set of data includes data representing mass density and nonlinear viscoelastic properties of a sponge rubber inside a dense rubber skin.

5. A method for designing a door seal system based upon a predicted contribution of the door seal system to sound pressure levels (SPLs) within an automotive vehicle due to wind noise, the method comprising the steps of:

(a) storing in a memory of a programmable digital computer system a material properties set of data representing predetermined properties of materials used in construction of the door seal system;

(b) storing into the memory a geometry set of data representing a predefined geometry for the door seal system, a geometry for an acoustic media determined by the deformed seal geometry and a geometry for a plurality of sealing surfaces in contact with the door seal system;

(c) storing into the memory a pressure spectra set of data representing a pressure spectra for an air flow over an external seal gap in the vehicle; and (d) computing a door seal transmission loss set of data, based on the material properties data, the geometry set of data, and the pressure spectra data, representing a door seal system contribution to the SPLs within the vehicle due to sound radiated by the seal gap;

(i) displaying the transmission loss data on the computer system;
   (ii) comparing the transmission loss data to a predefined wind noise criteria;
   (iii) changing the door seal system design by modifying the material properties data and the geometry set of data sets of data if the transmission loss data does not meet the wind noise criteria; and
   (iv) redoing steps (c) through (f) until the transmission loss data meets the predefined wind noise criteria.

6. A method according to claim 5 and further including the step, after step (b), of determining whether the door seal system meets a predefined compression load deflection criteria based upon the material properties data and the geometry set of data, by (i) changing the door seal system design by modifying the material data and the geometry set of data if the door seal system does not meet the compression load deflection criteria; and
   (ii) redoing this step until the door seal system meets the predefined compression load deflection criteria.

7. A method according to claim 6 and further including the step, after the step in claim 7, of determining whether the door seal system meets a predefined seal contact pressure criteria based upon the material properties data and the geometry set of data, by (i) changing the door seal system design by modifying the material data and the geometry set of data if the door seal system does not meet the seal contact pressure criteria; and
   (ii) redoing this step until the door seal system meets the predefined seal contact pressure criteria.

8. A method for designing a door seal system based upon a predicted contribution of the door seal system to sound pressure levels (SPLs) within an automotive vehicle due to wind noise, the method comprising the steps of:

selecting a door seal system design;
   determining a door seal system deformed geometry;
   combining the door seal system deformed geometry with geometries of the internal and external acoustic cavities to produce a fully coupled acoustic/structure model of the door seal system;
   predicting a sound transmission loss for the door seal system design under predetermined conditions using acoustics, finite deformation rubber elasticity, and steady state harmonic viscoelasticity; and
   changing the door seal design according to predefined rules to produce a seal design which provides a desired sound transmission loss level in the vehicle.

9. A computer based system for designing a door seal system based upon a predicted contribution of the door seal system to sound pressure levels (SPLs) within an automotive vehicle due to wind noise, the system comprising:

means for generating a first set of data representing mass density and nonlinear viscoelastic properties of materials used in construction of the door seal system;
   means for generating a second set of data representing a predefined geometry for the door seal system, a geometry for an acoustic media surrounding the door seal system, and a geometry for a plurality of sealing surfaces in contact with the door seal system;
   means for generating a third set of data representing a pressure spectra for an air flow over an external seal gap;
   memory means for storing the first, second and third sets of data;
   programmed data processor means coupled to the memory means for computing a fourth set of data, based on the first, second, and third sets of data, representing a door seal system contribution to the SPLs within the vehicle due to sound radiated by the seal gap; and
   display means coupled to processor means for displaying a first set of visual indicia representing the seal system contribution to the SPLs.

* * * * *